United States Patent [19]
Klose et al.

[11] Patent Number: 4,899,068
[45] Date of Patent: Feb. 6, 1990

[54] COMPARISON CIRCUIT WITH ERROR COMPENSATED MOS SWITCHES

[75] Inventors: Hans-Peter Klose, Halstenbek; Kurt König, Hamburg; Wolfgang Schwartz, Hamburg, all of Fed. Rep. of Germany

[73] Assignee: U.S. Philips Corporation, New York, N.Y.

[21] Appl. No.: 220,634

[22] Filed: Jul. 18, 1988

[30] Foreign Application Priority Data

Jul. 18, 1987 [DE] Fed. Rep. of Germany ....... 3723919

[51] Int. Cl.$^4$ .................. H03K 3/023; H03K 3/027; H03K 5/24; H03K 17/687
[52] U.S. Cl. ................... 307/494; 307/496; 307/497; 307/362; 307/355
[58] Field of Search ............... 307/362, 363, 355, 356, 307/576, 579, 585, 451, 448, 494, 496, 497, 500, 501; 328/147, 148, 149, 151

[56] References Cited

U.S. PATENT DOCUMENTS

| | | | |
|---|---|---|---|
| 4,316,105 | 2/1982 | Fowler | 307/362 |
| 4,450,368 | 5/1984 | Spence | 307/362 |
| 4,532,438 | 7/1985 | Reiner | 307/362 |
| 4,547,683 | 10/1985 | Bingham | 307/355 |
| 4,560,890 | 12/1985 | Masuda et al. | 307/355 |
| 4,691,189 | 9/1987 | Dingwall et al. | 307/362 X |
| 4,695,748 | 9/1987 | Kumamoto | 307/362 X |
| 4,707,624 | 11/1987 | Yee | 307/362 X |
| 4,760,287 | 7/1988 | Goto et al. | 307/362 X |
| 4,803,382 | 2/1989 | Tanimoto et al. | 307/355 X |

FOREIGN PATENT DOCUMENTS 0137074 6/1986 Japan .................. 307/362

OTHER PUBLICATIONS

"Markt und Technik", no. 9, pp. 76, Mar. 1, 1985.
Electronics Letters, vol. 22, no. 6, pp. 338-339, Mar. 13, 1986.

Primary Examiner—Andrew J. James
Assistant Examiner—David R. Bertelson
Attorney, Agent, or Firm—Bernard Franzblau

[57] ABSTRACT

An MOS comparison circuit (1) for comparing two input voltages and comprising a differential amplifer (8). During a first time period, a first input (−) of the differential amplifer is supplied, via a first capacitor (9) and a switch (10), with a first input voltage (Ue). During a second time period, succeeding the first time period, a second input voltage (Ud) is supplied to the first input (−) of the amplifier by means of the first capacitor and a switch (11) of a switch arrangement (10, 11). The second input (+) of the differential amplifier is connected to a reference voltage during the first time period and its output is at that time connected to the first input and to the second input (+) of the amplifier via switches (12) and (16), respectively. The second imput (+) of the differential amplifier is connected through a second capacitor (13) and a change-over device (14, 15) to the reference voltage source (17). The change-over device (14, 15) alternately connects, during the two time periods, the second capacitor to the reference voltage source.

6 Claims, 1 Drawing Sheet

COMPARISON CIRCUIT WITH ERROR COMPENSATED MOS SWITCHES

BACKGROUND OF THE INVENTION

This invention relates to a comparison circuit, obtained according to MOS technology, for comparing two input voltages and comprising a differential amplifier,
- to whose first input are supplied through a first capacitor during a first time period a first input voltage and during a second time period succeeding the first time period a second input voltage by means of a switch arrangement,
- whose second input is applied to a reference voltage and
- whose output is connected to the first input during the first time period.

Such a comparison circuit is used, for example, in analog-to-digital converters which operate according to the successive approximation principle. Such an analog-to-digital converter further consists of a digital-to-analog converter and of a control circuit which delivers the digital output signal. The control circuit sets at the start of a conversion process the bit of highest value, which is subjected to a digital-to-analog conversion and is compared in the comparison circuit with the analog input signal. If the comparison signal subjected to a digital-to-analog conversion is smaller than the analog input signal, the bit of highest value remains set, whereas it is reset if this signal is larger. The comparison is repeated successively with the next bit. Thus, the digital output signal is caused to approach in a stepwise manner the analog input signal.

The comparison circuit mentioned in the opening paragraph is known from the magazine "Markt und Technik", No. 9 of Mar. 1st 1985, p. 76. During the first time period, the difference between the first input voltage and the volume produced at the first input of the differential amplifier when the output and the first input are interconnected is applied to the first capacitor. The operation of connecting the output to the first input of the differential amplifier serves to adjust the working-point of the differential amplifier. During the second time period, the sum of the second output voltage and the voltage adjusted at the first capacitor during the first time period is applied to the input of the differential amplifier. The differential amplifier produces an output voltage in dependence upon the voltage at the first input. The output voltage of the differential amplifier has a high or a low voltage state.

The switch arrangement of the comparison circuit, which consists of two parallel-connected switches, is constituted by MOS field effect transistors. Such transistors do not constitute an ideal switch. While the switches are closed (the transistors are conducting), a charge is stored in the channel of the respective transistor. When the switch is opened (the transistors are cut off), the charge stored in the channel flows away. In the comparison circuit, an additional charge is supplied to the first capacitor due to the fact that the charge of the first switch flows away. Because of this additional charge, a false voltage comparison can be obtained, especially in the case of voltages to be compared which deviate slightly from each other. In fact, instead of a high and low signal state, respectively, a low and high signal state, respectively, occurs in the output signal of the differential amplifier. As a result, during the analog-to-digital conversion, a digital signal is produced whose value does not accurately correspond to the analog input signal.

SUMMARY OF THE INVENTION

An object of the invention is to provide a comparison circuit of the kind mentioned in the opening paragraph, in which the loss of charge of the first switch does not exert any influence on the comparison.

According to the invention, this object is achieved in that the second input of the differential amplifier is connected to a reference voltage source through a second capacitor and a change-over device. Also, the change-over device alternately connects the second capacitor to the reference voltage source during the two time periods and the output of the reference voltage source is connected during the first time period to the second input.

In the circuit according to the invention, during the first time period, the first input signal is supplied to the first capacitor and a reference voltage is supplied to the second capacitor through the change-over device. The output is connected to the first input and to the second input. A voltage corresponding to the sum of the reference voltage and of the voltage adjusted by the connection of the second input to the output of the differential amplifier at the second input is applied to the second capacitor, which has the same capacitance as the first capacitor. During the second time period, the change-over device is changed over in order that the same switching processes occur as at the switch arrangement. During the first time period and during the second time period, the same reference voltage is always applied to the second capacitor. Therefore, the second input always is applied to the same reference potential. This reference potential is varied, however, by the channel charge losses of the switch arrangement constituted by the MOS field effect transistors.

The additional voltage at the first capacitor, which is produced due to the fact that the charge of the switch arrangement constituted by the MOS transistors flows away, and the additional voltage at the second capacitor, which is produced due to the fact that the charge of the switch arrangement flows away, are equal with regard to magnitude and phase provided that approximately identical transistors are used. Therefore, voltages varying in the same manner are supplied to the two inputs of the differential amplifier. Since a differential amplifier has a high common mode rejection, these additional voltages have little influence on the output signal of the differential amplifier and therefore cannot lead to a false comparison.

The differential amplifier has two output terminals, which may be interconnected, for example, by means of a current mirror and pass on to the next circuit difference voltage with respect to ground. The output terminals may also be directly connected to the next circuit. This second possibility should preferably be used because, in the case of a direct voltage offset of the differential amplifier, this amplifier may operate outside its linear range.

It should further be noted that the magazine "Electronic Letters", Mar. 13th 1986, Vol. 22. No. 6, pp. 338 to 339 also discloses a comparison circuit, in which the non-inverting input and the inverting input of a differential amplifier are connected each through a capacitor to each time two differently clocked switches constructed as MOS transistors. The input terminals of the switches are operated with the same clock signal and thus are joined together. The switches, which are closed during a first time period, receive the input voltage to be converted, while the two remaining switches receive the comparison voltage. In the comparison circuit according to the invention, a reference voltage is supplied to the second input instead of alternately the input voltage and the comparison voltage. As a result, the comparison circuit according to the invention does not connect, after each comparison of a bit, the output to its two inputs, as is necessary in the circuit described in the last-mentioned magazine. The input/output connection is necessary in the circuit according to the invention only at the start of the conversion process. In accordance with the invention, the conversion time is therefore shortened with the use of the comparison circuit in an analog-to-digital converter.

In a further embodiment of the invention, a first switch is provided which is closed during the first time period and applies the first input voltage to the first terminal of the first capacitor. A second switch is provided which, together with the first switch constitues the switch arrangement. The second switch is closed during the second time period for applying the second input voltage to the first terminal of the first capacitor. The first input of the differential amplifier, having highohmic inputs, is coupled to the second terminal of the first capacitor and through a third switch, closed during the first time period, to its output. The second input of the differential amplifier is coupled through the second capacitor to fourth and fifth switches, which constitute the change-over device and are both connected to a reference voltage source. The fourth and sixth switches are closed during the first time period and the fifth switch is closed during the second time period. The additional voltage at the capacitor is produced due to the fact that the charge of the first switch flows away and the additional voltage at the second capacitor is produced due to the fact that the charge of the fourth switch flows away. The voltages varying in the same manner, and caused by the fact that the charge of the first and fourth switches flows away, are compensated for by the common mode rejection of the differential amplifier.

The switches in the comparison circuit are constituted by the parallel arrangement of the drain/source path of an N-channel MOS field effect transistor and the drain/source path of a P-channel MOS field effect transistor. These transistors are controlled by supplying a switching signal to the gate connection of the N-channel transistor and an inverted switching signal to the gate connection of the P-channel transistor.

BRIEF DESCRIPTION OF THE DRAWING

In order that the invention may be readily carried out, it will now be described more fully, by way of example, with reference to the accompanying drawings, in which.

DESCRIPTION OF THE PREFERRED EMBODIMENTS

Figure 1:
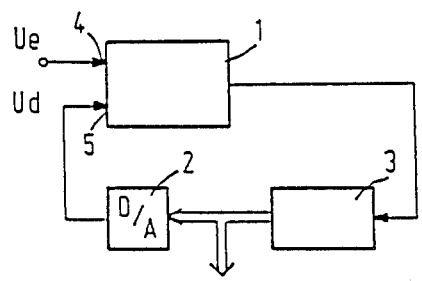
FIG. 1 shows a principal circuit diagram of an analog-to-digital converter which operates according to the successive approximation principle.

FIG. 1 shows an analog-to-digital converter which operates according to the successive approximation principle and comprises a comparison circuit 1, a digital-to-analog converter 2 and a control circuit 3. The analog input voltage Ue to be converted is supplied to an input 4 of the comparison circuit 1, which receives at its other input 5 a second input voltage Ud from the digital-to-analog converter 2. At the start of the conversion process the control circuit 3 sets the bit of highest value, which is converted in the digital-to-analog converter 2 into an analog voltage. The comparison circuit compares the analog input voltage Ue at the input 4 with the analog voltage Ud supplied by the digital-to-analog converter 2. When the voltage Ud supplied by the digital-to-analog converter 2 is smaller than the analog input voltage Ue at the input 4, the bit of highest value remains set, whereas when the analog voltage Ud of the digital-to-analog converter 2 is larger, the bit of highest value is reset. After this first comparison, a comparison with the next bit is carried out, that is to say that the control circuit 3 sets the next bit. Thus, the digital output signal of the control circuit 3 is caused to approach in a stepwise manner the analog input voltage Ue at the input 4 of the comparison circuit 1.

Figure 2:
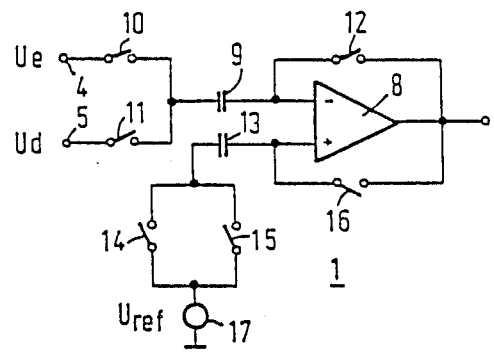
FIG. 2 shows a comparison circuit according to the invention.

FIG. 2 shows an embodiment of the comparison circuit 1 according to the invention. The comparison circuit 1 comprises a differential amplifier 8, whose inverting high-ohmic input is connected to a terminal of a first capacitor 9. A first switch 10 is arranged between the input 4, to which the analog input voltage Ue is supplied, and the other terminal of the capacitor 9. A second switch 11, which receives from the input 5 the output voltage Ud of the digital-to-analog converter 2, is connected to the aforesaid other terminal of the first capacitor 9. A third switch 12 is connected between the inverting input and the output of the differential amplifier 8.

The non-inverting high-ohmic input of the differential amplifier 8 is connected to a terminal of a second capacitor 13, whose other terminal is coupled through a fourth switch 14 and a fifth switch 15 connected parallel thereto to a reference voltage source 17. The second capacitor 13 has the same capacitance as the first capacitor 9. A sixth switch 16 is arranged between the noninverting input of the differential amplifier 8 and its output.

A comparison operation is carried out in the following manner. During a first time period, the switches 10, 12, 14 and 16 are closed. At the capacitor 9, is a voltage is produced which is formed from the difference between the analog input voltage Ue and the voltage occurring at the inverting input of the differential amplifier 8 until the switch 12 is closed. The voltage at the capacitor 13 is formed from the difference between the reference voltage Uref of the reference voltage source 17 and the voltage which is developed at the non-inverting input of the differential amplifier 8 when the switch 16 is closed. The operation of closing the switches 12 and 16 serves as the operating-point adjustment of the differential amplifier.

During a second time period succeeding the first time period, the switches 11 and 15 are closed and the switches 10, 12, 14 and 16 are opened. At the capacitor 9 a voltage is then adjusted, which is formed from the sum of the output voltage Ud of the digital-to-analog converter 2 and of the voltage adjusted during the first time period. At the capacitor 13 a voltage occurs, which is formed from the sum of the reference voltage Uref and the voltage adjusted during the first time period. During the first and second time periods the reference voltage Uref is applied each time to the input terminal of the capacitor 13. Therefore, the voltage at the capacitor 13 during the second time period is equal to the voltage which is adjusted at the non-inverting input of the differential amplifier 8 during the first time period when the switch 16 is closed.

The differential amplifier 8 has such a high amplification that its output voltage assumes, in dependence upon the input voltage at its two inputs, either a high or a low voltage state. The voltage state of the output voltage of the differential amplifier 8 is therefore determined by the difference between the analog input voltage Ue and the voltage Ud of the digital-to-analog converter 2.

The switches 10 to 12 and 14 to 16 each consist of at least a MOS field effect transistor. Such transistors do not constitute ideal switches. When the switches are closed, that is to say when the transistors are conducting, a charge is stored in the channel of the transistor. When a switch is opened, that is to say when the transistor is cut off, charge flows away from the channel of the transistor. During the second time period, channel charges of the switches 10 and 12 therefore flow into the capacitor 9 and channel charges of the switches 14 and 16 flow into the capacitor 13. Assuming that the switches are composed of identical transistors, charges are stored in the capacitors 9 and 13 which produce a voltage at the non-inverting and the inverting input, respectively, which voltages have substantially the same magnitude and the same phase.

The common mode voltages at the inverting and at the non-inverting input of the differential amplifier 8, which are produced by channel charges of the switches 10, 12, 14 and 16, are substantially rejected because a differential amplifier has a high common mode rejection.

Figure 3:
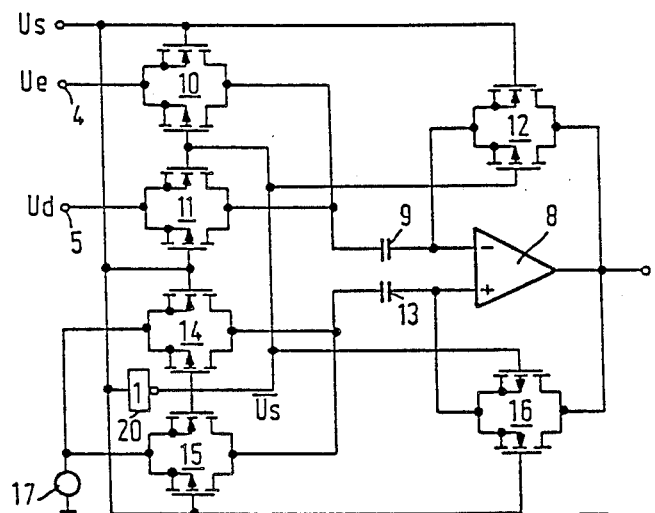
FIG. 3 shows a more detailed embodiment of the circuit shown in FIG. 2.

A slightly more detailed embodiment of the comparison circuit according to FIG. 2 is shown in FIG. 3. The switches 10 to 12 and 14 to 16 are each constituted by an N-channel MOS field effect transistor and a P-channel MOS field effect transistor. The field effect transistors are of the normally-off type (enhancement type). The source/drain paths of each pair of two transistors are connected in parallel. A switching signal Us is supplied to the gate connections of the N-channel transistors of the switches 10, 12, 14 and 16 and of the P-channel transistors of the switches 11 and 15. The inverted switching signal Us is supplied to the N-channel transistors of the switches 11 and 15 and to the P-channel transistors of the switches 10, 12, 14 and 16. The inverted switching signal $\overline{Us}$ is obtained by means of an inverter 20, which receives the switching signal Us.

The comparison circuit shown in FIGS. 2 and 3 has a differential amplifier 8 whose output is constituted by an output terminal. The two output terminals of the differential amplifier 8 are interconnected, for example, by means of a current mirror, not shown. In the case of a direct voltage offset of the differential amplifier 8, there is a possibility that this amplifier operates outside its linear range.

Figure 4:
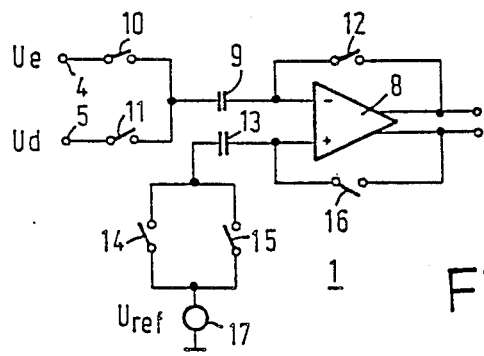
FIG. 4 shows a further comparison circuit according to the invention.

In order to avoid this, the differential amplifier 8 is operated, as shown in FIG. 4, in such a manner that its two output terminals are directly connected to the control circuit 3. The two output terminals then cannot influence each other upon closure of the switches 12 and 16 and therefore cannot bring the differential amplifier 8 into an operating range lying outside of the linear operating range.

What is claimed is:

1. In an MOS device, a comparison circuit for comparing two input voltages, comprising: a differential amplifier including
   a first input supplied through a first capacitor and a switch arrangement during a first time period with a first input voltage (Ue) and during a second time period, succeeding the first time period, with a second input voltage (Ud) by means of the first capacitor and the switch arrangement,
   means connecting a second input of the differential amplifier via a second capacitor and a change-over device to a reference voltage source whereby the change-over device alternately connects the second capacitor to the reference voltage source during said first and second time periods, and second means connecting an output of the differential amplifier during the first time period to the first and the second input thereof.

2. A comparison circuit as claimed in claim 1, wherein said switch arrangement comprises a first switch which is closed during the first time period so as to apply the first input voltage to a first terminal of the first capacitor and a second switch closed during the second time period for applying the second input voltage to the first terminal of the first capacitor, the first input of the differential amplifier being coupled to a second terminal of the first capacitor, wherein said second connecting means includes a third switch closed during the first time period for coupling the first input of the differential amplifier to its output, wherein said change-over device includes fourth and fifth switches which couple the second input of the differential amplifier via the second capacitor to the reference voltage source, and wherein said second connecting means includes a sixth switch for coupling the output of the differential amplifier to the second input thereof, the fourth and sixth switches being closed during the first time period and the fifth switch being closed during the second time period.

3. A comparison circuit as claimed in claim 2, characterized in that the switches each comprise the parallel arrangement of a drain/source path of an N-channel MOS field effect transistor and of a drain/source path of a P-channel MOS field effect transistor, and wherein a gate connection of the N-channel transistor receives a switching signal and a gate connection of the P-channel transistor receives an inverted switching signal.

4. A comparison circuit comprising:
   a differential amplifier having first and second inputs and an output,
   first and second input terminals for supplying first and second analog input voltages,
   first means connecting said first input terminal to said first input of the amplifier via a first MOS switch and a first capacitor,
   second means connecting said second input terminal to said first input of the amplifier via a second MOS switch and said first capacitor,
   a second capacitor and a change-over device including third and fourth MOS switches for coupling said second input of the differential amplifier to a source of reference voltage, fifth and sixth switches for coupling said output of the differential amplifier to said first and second inputs thereof, respectively, and means for operating said switches so that during a first time period the first, third, fifth and sixth switches are closed and the second and fourth switches are open and, during a second time period, the second and fourth switches are closed and the first, third, fifth and sixth switches are open.

5. A comparison circuit as claimed in claim 4, wherein each of said switches comprise a pair of parallel connected MOSFET elements having gate electrodes coupled to said operating means.

6. A successive approximation A/D inverter comprising:

an input terminal for an analog input signal to be converted into a digital signal, a comparison circuit including a differential amplifier having first and second inputs and an output coupled to said second input of the amplifier via a control circuit and a D/A converter, wherein said comparison circuit further comprises:

a first MOS switch and a first capacitor coupled in series circuit between said input terminal and said first input of the differential amplifier, a second MOS switch connected in a second series circuit with the first capacitor between an output of the D/A converter and the first input of the differential amplifier, a second capacitor and change-over device for coupling said second input of the differential amplifier to a source of reference voltage, switching means for coupling said output of the differential amplifier to said first and second inputs thereof, and means for operating said first and second MOS switches, said change-over device and said switching means so that, during a first time period, said input signal is applied to the first input of the differential amplifier via the first series circuit, said switching means couples the amplifier output to said first and second inputs thereof, and said change-over device couples said second input of the differential amplifier to said reference voltage source via the second capacitor, and, during a second time period, said input signal is decoupled from the first input of the differential amplifier via the first MOS switch, said amplifier output is decoupled from said first and second inputs thereof via said switching means, and said first and second amplifier inputs are coupled via said second series circuit and said change-over device, respectively, to said output of the D/A converter and to said source of reference voltage, respectively.

* * * * *